United States Patent
Hou et al.

(10) Patent No.: US 10,204,968 B2
(45) Date of Patent: Feb. 12, 2019

(54) ORGANIC LIGHT-EMITTING DISPLAY SUBSTRATE, METHOD OF FABRICATING THE SAME, DISPLAY PANEL, AND DISPLAY DEVICE

(71) Applicant: BOE TECHNOLOGY GROUP CO., LTD., Beijing (CN)

(72) Inventors: Wenjun Hou, Beijing (CN); Ze Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/129,091

(22) PCT Filed: Jan. 15, 2016

(86) PCT No.: PCT/CN2016/070987
§ 371 (c)(1),
(2) Date: Sep. 26, 2016

(87) PCT Pub. No.: WO2017/012309
PCT Pub. Date: Jan. 26, 2017

(65) Prior Publication Data
US 2017/0194394 A1    Jul. 6, 2017

(30) Foreign Application Priority Data
Jul. 23, 2015 (CN) .......................... 2015 1 0437294

(51) Int. Cl.
*H01L 27/32* (2006.01)
*H01L 51/56* (2006.01)
*H01L 51/00* (2006.01)

(52) U.S. Cl.
CPC ...... *H01L 27/3246* (2013.01); *H01L 51/0005* (2013.01); *H01L 51/0012* (2013.01); *H01L 51/56* (2013.01)

(58) Field of Classification Search
None
See application file for complete search history.

(56) References Cited

U.S. PATENT DOCUMENTS

2012/0032207 A1    2/2012    Nishiyama et al.

FOREIGN PATENT DOCUMENTS

| CN | 101202328 A | 6/2008 |
|----|-------------|--------|
| CN | 103367391 A | 10/2013 |

(Continued)

OTHER PUBLICATIONS

Office Action dated Sep. 5, 2017 issued in Chinese Application No. 201510437294.9.

(Continued)

*Primary Examiner* — Jack Chen
(74) *Attorney, Agent, or Firm* — Nath, Goldberg & Meyer; Joshua B. Goldberg; Daniel Bissing

(57) ABSTRACT

The present invention provides an organic light-emitting display substrate, a method of fabricating the same, an organic light-emitting display panel, and an organic light-emitting display device. The organic light-emitting display substrate comprises a pixel defining layer provided on a base substrate and configured to define a sub-pixel region, the pixel defining layer comprises an accommodation area corresponding to a sub-pixel, and a groove located on an outer peripheral side of the accommodation area. In a process of forming an organic light-emitting layer by means of inkjet printing, excessive ink flows into the groove on the outer peripheral side of the accommodation area, which facilitates matching between a volume of ink for forming the organic light-emitting layer and a thickness of an actual organic light-emitting layer.

10 Claims, 1 Drawing Sheet

(56) References Cited

FOREIGN PATENT DOCUMENTS

| CN | 104282729 A | 1/2015 |
| CN | 104638147 A | 5/2015 |
| CN | 105118845 A | 12/2015 |
| EP | 1933393 A1 * | 6/2008 |

OTHER PUBLICATIONS

Form PCT/ISA/237 issued in corresponding international application No. PCT/CN2016/070987 dated Apr. 28, 2016.

* cited by examiner

ORGANIC LIGHT-EMITTING DISPLAY SUBSTRATE, METHOD OF FABRICATING THE SAME, DISPLAY PANEL, AND DISPLAY DEVICE

This is a National Phase Application filed under 35 U.S.C. 371 as a national stage of PCT/CN2016/070987, filed Jan. 15, 2016, an application claiming the benefit of Chinese Application No. 201510437294.9, filed Jul. 23, 2015, the content of each of which is hereby incorporated by reference in its entirety.

FIELD OF THE INVENTION

The present invention relates to the field of display technology, and particularly relates to an organic light-emitting display substrate, a method of fabricating the same, a display panel, and a display device.

BACKGROUND OF THE INVENTION

In comparison with liquid crystal display, organic light-emitting diode (OLED) display has the advantages of self-luminescence, fast response, wide viewing angle, high brightness, bright color and small thickness, and is considered as next-generation display technology.

A thin film of an organic light-emitting device is prepared mainly by means of vacuum evaporation or with a solution method. Vacuum evaporation is suitable for small organic molecules, the film prepared by means of vacuum evaporation has good uniformity, and vacuum evaporation technology is relatively mature. However, in the vacuum evaporation technology, it is high in equipment cost, and is low in utilization ratio of materials and alignment accuracy of masks used in large-dimension products. The solution method is suitable for polymer materials and soluble small molecules, is low in equipment cost, and has prominent advantages in large-dimension mass production. A process of the solution method includes spin coating, inkjet printing, nozzle coating method, and so on.

A process of manufacturing an OLED display device by means of inkjet printing comprises: ejecting, by an inkjet printer, a soluble material of OLED functional layer with a certain volume to a corresponding sub-pixel region; and then forming an organic light-emitting layer by means of drying. Due to the factors such as a few types of inkjet heads of an inkjet printer, different requirements of ink viscosity and surface tension for the inkjet heads, different ink characteristics and requirements of ink film formation process, and different sizes of sub-pixels determined according to a design of display panel, it often occurs that, in a process of inkjet printing, a thickness of an organic thin film is less than a thickness required by the device after n droplets of ink have been ejected, and is greater than the thickness required by the device after (n+1) droplets of ink have been ejected, so that an ink volume cannot be matched with a thickness required by a display device structure.

SUMMARY OF THE INVENTION

An object of the present invention is to solve the problem that a volume of ink far forming an organic light-emitting layer cannot be matched with a thickness of an actual organic light-emitting layer in an organic light-emitting display substrate, an organic light-emitting display panel and an organic light-emitting display device in the prior art.

Embodiments of the present invention provide an organic light-emitting display substrate, comprising a pixel defining layer provided on a base substrate and configured to define a sub-pixel region, the pixel defining layer comprises an accommodation area corresponding to a sub-pixel, and a groove located on an outer peripheral side of the accommodation area.

A volume of the accommodation area may be equal to that of ink used for forming the sub-pixel.

A volume of the groove may be smaller than that of one droplet of ink of an inkjet printer used for forming the sub-pixel.

The pixel defining layer may further comprise a first shoulder which defines the accommodation area, and a second shoulder which defines the groove together with the first shoulder.

The accommodation area may be surrounded by the first shoulder.

The first shoulder may be provided on a side of the groove close to the accommodation area, and the second shoulder may be provided on a side of the groove away from the accommodation area.

A height of the first shoulder may be smaller than that of the second shoulder.

The second shoulder may comprise a hydrophobic material.

The first shoulder may comprise a hydrophobic material or a hydrophilic material.

The hydrophobic material may comprise fluorinated polyimide resin.

The hydrophilic material may comprise polyimide resin, $SiO_2$ or $SiN_x$.

Embodiments of the present invention further provide an organic light-emitting display panel, comprising the aforesaid organic light-emitting display substrate.

Embodiments of the present invention further provide an organic light-emitting display device, comprising the aforesaid organic light-emitting display panel.

Embodiments of the present invention further provide a method of fabricating an organic light-emitting display substrate, comprising: forming, by a patterning process, a pattern of a first shoulder on a base substrate so as to form an accommodation area and an area to be filled which are alternately arranged, the first shoulder being formed between the accommodation area and the area to be filled; and forming, by a patterning process, a pattern of a groove on an outer peripheral side of the accommodation area in the area to be filled.

Each accommodation area may be surrounded by the first shoulder, and the accommodation area may correspond to a sub-pixel of the organic light-emitting display substrate.

In the method, the step of forming a pattern of a groove may comprise forming a hydrophobic material layer in the area to be filled, and performing a patterning process on the hydrophobic material layer so as to form the pattern of the groove.

In the method, the step of forming a pattern of a groove may comprise forming a hydrophobic material layer on the base substrate on which the pattern of the first shoulder is formed; and performing a patterning process on the hydrophobic material layer so as to expose the accommodation area and form the pattern of the groove on an outer peripheral side of the accommodation area in the area to be filled.

In the method, a pattern of a second shoulder may be formed in the area to be filled by performing a patterning process on the hydrophobic material layer located in the area to be filled, so as to form the groove between the first shoulder and the second shoulder.

A thickness of the hydrophobic material layer may be greater than that of the first shoulder.

A height of the second shoulder may be greater than that of the first shoulder.

In the organic light-emitting display substrate, the method of fabricating the same, the organic light-emitting display panel, and the organic light-emitting display device provided by the embodiments of the present invention, by providing an accommodation area corresponding to a sub-pixel and a groove located on an outer peripheral side of the accommodation area in the organic light-emitting display substrate, ink for forming an organic light-emitting layer in an inkjet printing process is accommodated in the accommodation area, and excessive ink flows into the groove on the outer peripheral side of the accommodation area, which can ensure that the excessive ink is separated from the ink for forming the organic light-emitting layer and facilitate matching between a volume of the ink for forming the organic light-emitting layer and a thickness of the actual organic light-emitting layer.

DETAILED DESCRIPTION

In order to make those of skilled in the art better understand the technical solutions of the present invention, the present invention will be further described in detail below with reference to the accompanying drawings and specific implementations.

Figure 1:
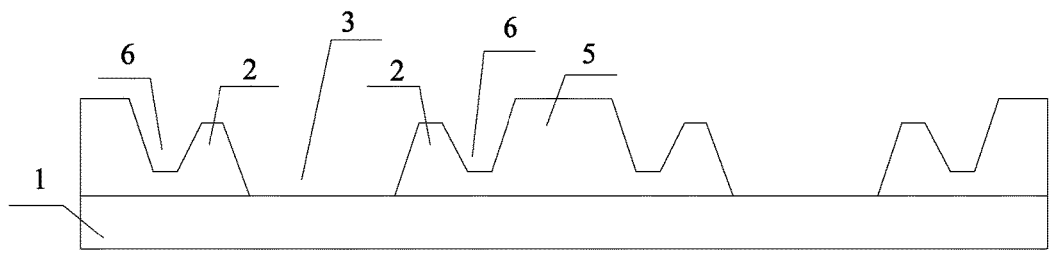
FIG. 1 is a structural schematic diagram of an organic light-emitting display substrate comprising patterns of an accommodation area and a groove according to an embodiment of the present invention.

With reference to FIG. 1, an embodiment of the present invention provides an organic light-emitting display substrate, comprising a pixel defining layer provided on a base substrate 1 and configured to define a sub-pixel region. The pixel defining layer comprises an accommodation area 3 corresponding to a sub-pixel, and a groove 6 located on an outer peripheral side of the accommodation area 3. The pixel defining layer may further comprise a first shoulder 2 which defines the accommodation area 3, and a second shoulder 5 which defines the groove 6 together with the first shoulder 2.

In the organic light-emitting display substrate provided by the embodiment of the present invention, by providing the accommodation area 3 corresponding to a sub-pixel and the groove 6 located on the outer peripheral side of the accommodation area 3, ink for forming an organic light-emitting layer in an inkjet printing process is accommodated in the accommodation area 3, and excessive ink flows into the groove 6 on the outer peripheral side of the accommodation area 3, which can ensure that the excessive ink is separated from the ink for forming the organic light-emitting layer and facilitate matching between a volume of the ink for forming the organic light-emitting layer and a thickness of the actual organic light-emitting layer.

In the embodiment, a volume of the accommodation area 3 may be equal to that of ink used for forming the sub-pixel.

It should be understood that for a particular inkjet printer, a volume of ink required for forming a sub-pixel having a specific size and a specific thickness can be determined according to specification of inkjet head, ink characteristics and a size of a sub-pixel, and then the accommodation area 3 having a volume equal to said volume of ink required for forming the sub-pixel is formed by a patterning process. In a subsequent drying process, the sub-pixel having a specific size and a specific thickness can be formed by the ink in the accommodation area 3, so that a volume of ink for forming an organic light-emitting layer is matched with a thickness of an actual organic light-emitting layer.

In the embodiment, a volume of the groove 6 may be smaller than that of one droplet of ink of an inkjet printer used for forming the sub-pixel. In such case, a volume of the ink in the accommodation area 3 can be allowed to be greater than that of n droplets of ink but smaller than that of (n+1) droplets of ink. After the ink is ejected in the accommodation area 3, excessive ink (which has a volume smaller than that of one droplet of ink) flows into the groove 6, so as to adjust the volume of the ink in the accommodation area 3 as well as reduce the volume of the groove 6 to the greatest extent to decrease a distance between sub-pixels.

In the embodiment, the accommodation area 3 may be surrounded by the first shoulder 2. In addition, the first shoulder 2 may be arranged on a side of the groove 6 close to the accommodation area 3, and the second shoulder 5 may be arranged on a side of the groove 6 away from the accommodation area 3. The groove 6 may be defined by the first shoulder 2 close to the accommodation area 3 and the second shoulder 5 away from the accommodation area 3. The groove 6 may be provided between the first shoulder 2 and the second shoulder 5.

In the embodiment, a height of the second shoulder 5 may be greater than that of the first shoulder 2. In particular, a height of the first shoulder 2 on a side of the groove 6 close to the accommodation area 3 may be smaller than that of the second shoulder 5 on a side of the groove 6 away from the accommodation area 3. In such case, the ink in the groove 6 is unlikely to overflow into an adjacent sub-pixel region in a fabrication process, so as to prevent ink of adjacent sub-pixels from contaminating each other.

In the embodiment, the second shoulder 5 may be made of a hydrophobic material. In such case, the ink used for forming adjacent sub-pixels can be prevented from climbing the second shoulder 5 due to good wettability of the second shoulder 5, so as to avoid cross contamination of the ink used for forming adjacent sub-pixels.

In the embodiment, the first shoulder 2 may be made of a hydrophobic material or a hydrophilic material. Requirements of the material of the first shoulder 2 may be relaxed, so that the first shoulder 2 may be made of either a hydrophobic material or a hydrophilic material.

For example, the hydrophobic material may comprise fluorinated polyimide resin, and the hydrophilic material may comprise polyimide resin, $SiO_2$ or $SiN_x$.

In the embodiment, the groove 6 may have a cross-sectional shape of an inverted trapezoid having an upward opening. It should be understood that the groove 6 may have other cross-sectional shapes as long as excessive ink can be held therein.

In addition, there may be a plurality of grooves 6. In such a case, the plurality of grooves 6 are provided between the first shoulder 2 and the second shoulder 5. The number of the grooves 6 can be set according to specific application conditions.

It should be understood that the aforesaid hydrophobic material and hydrophilic material are merely for exemplary illustration, and other hydrophobic materials or hydrophilic materials capable of being used for forming a pixel defining layer in the prior art can also be adopted.

It should be understood that the organic light-emitting display substrate may further comprise other functional layers which will not be described here one by one.

Embodiments of the present invention further provide an organic light-emitting display panel, comprising the aforesaid organic light-emitting display substrate.

Embodiments of the present invention further provide an organic light-emitting display device, comprising the aforesaid organic light-emitting display panel.

The organic light-emitting display device can be used in any product or component having a display function, such as a mobile phone, a tablet computer, a TV set, a monitor, a notebook computer, a digital photo frame, a navigator and the like.

Embodiments of the present invention further provide a method of fabricating an organic light-emitting display substrate, comprising the following step S1 and step S2.

In the step S1, a pattern of a first shoulder 2 is formed on a base substrate 1 by a patterning process, so as to form an accommodation area 3 and an area 4 to be filled which are alternately arranged, the first shoulder 2 is formed between the accommodation area 3 and the area 4 to be filled.

Figure 2:
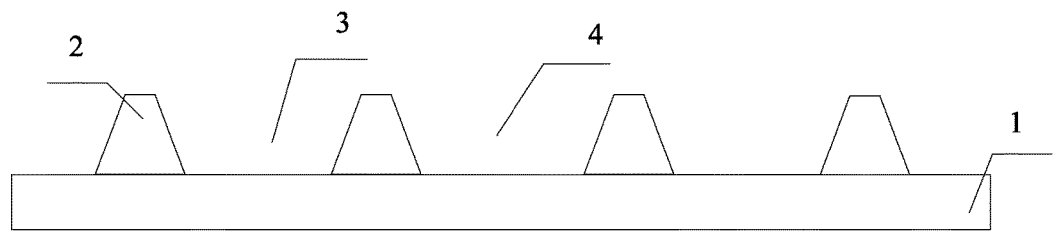
FIG. 2 is a structural schematic diagram of an organic light-emitting display substrate after forming patterns of an accommodation area and an area to be filled according to an embodiment of the present invention.

As shown in FIG. 2, the base substrate 1 is covered with a material layer, and a patterning process is performed on the material layer to form the pattern of the first shoulder 2, so as to form the accommodation area 3 and the area 4 to be filled which are alternately arranged. Each accommodation area 3 may be surrounded by the first shoulder 2. The accommodation area 3 corresponds to a sub-pixel formed in subsequent steps. A groove 6 will be formed in the area 4 to be filled in a subsequent step.

As shown in FIG. 2, the first shoulder 2 is formed between the alternately arranged accommodation area 3 and area 4 to be filled by a patterning process, and the pattern of the first shoulder 2 defines the accommodation area 3 and the area 4 to be filled. Both the accommodation area 3 and the area 4 to be filled are exposed areas formed on the base substrate 1 by etching portions of the material layer.

The material layer may be a hydrophilic material layer. The material layer may comprise polyimide resin. Alternatively, the material layer may be a hydrophobic material layer. For example, the material layer may comprise fluorinated polyimide resin. In addition, the material layer may comprise other hydrophilic materials, such as $SiO_2$ and $SiN_x$. Correspondingly, the film layer may be formed by means of deposition.

It should be understood that a thickness of the material layer (for example, a height of the first shoulder 2), and sizes of the accommodation area 3 and the area 4 to be filled should be matched with a volume of ink for forming a sub-pixel, and can be calculated according to specific application conditions, which will not be described here one by one.

It should be noted that the "pattern" in the embodiment of the present invention indicates structures formed by a patterning process. In addition, the "pattering process" in the embodiment of the present invention may comprise a part or all of the processes of photoresist coating, mask arrangement, exposure, development, etching, and photoresist stripping.

In the step S2, a pattern of a groove 6 is formed on an outer peripheral side of the accommodation area 3 in the area 4 to be filled by a patterning process.

Figure 3:
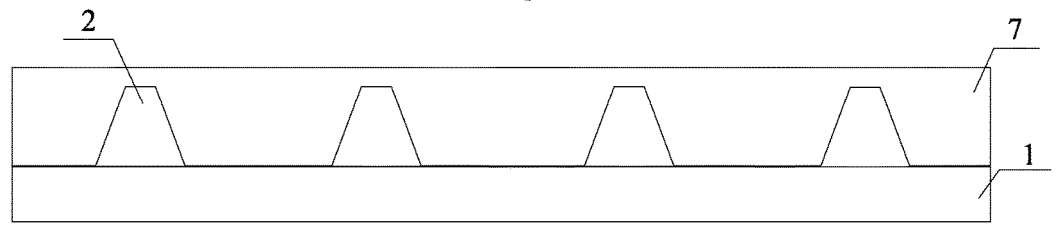
FIG. 3 is a structural schematic diagram of an organic light-emitting display substrate after a hydrophobic material layer is coated according to the embodiment of the present invention.

As shown in FIG. 3, the base substrate 1 on which the step S1 is performed is covered with a hydrophobic material layer 7. The hydrophobic material layer 7 can cover the accommodation area 3, the area 4 to be filled and the first shoulder 2. A thickness of the hydrophobic material layer 7 may be greater than a height of the first shoulder 2. For example, the hydrophobic material layer 7 may be a layer of fluorinated polyimide resin.

Figure 4:
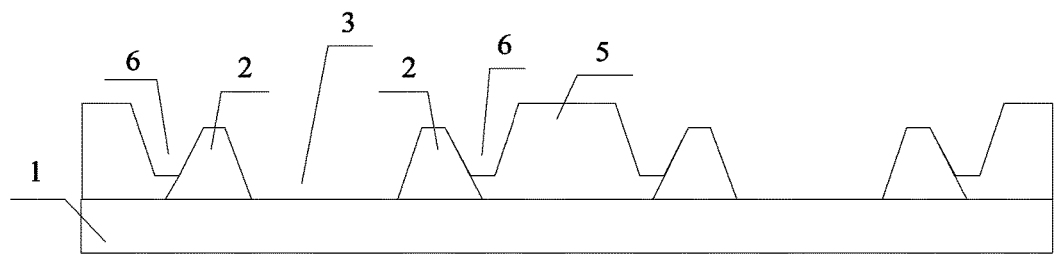
FIG. 4 is a structural schematic diagram of an organic light-emitting display substrate after forming a pattern of a groove according to the embodiment of the present invention.

As shown in FIG. 4, a patterning process is performed on the hydrophobic material layer 7 so as to expose the accommodation area 3 and form the pattern of the groove 6 on the outer peripheral side of the accommodation area 3. By performing a patterning process on the hydrophobic material layer 7 located in the area 4 to be filled, a pattern of a second shoulder 5 can be formed in the area 4 to be filled, so as to form the groove 6 between the first shoulder 2 and the second shoulder 5. The first shoulder 2 may be provided on a side of the groove 6 close to the accommodation area 3, and the second shoulder 5 may be provided on a side of the groove 6 away from the accommodation area 3.

Two grooves 6 on adjacent sides of two adjacent accommodation areas 3 may be formed in the area 4 to be filled between the two adjacent accommodation areas 3. In the area 4 to be filled, the grooves 6 may be formed on two sides of the second shoulder 5 and are adjacent to the accommodation areas 3, respectively.

A height of the second shoulder 5 may be greater than that of the first shoulder 2. A height of the first shoulder 2 on a side of the groove 6 close to the accommodation area 3 may be smaller than that of the second shoulder 5 on a side of the groove 6 away from the accommodation area 3. The height of the second shoulder 5 may be equal to that of the hydrophobic material layer 7.

In the embodiment of the present invention, with reference to FIG. 1, the patterns of the accommodation area 3 and the groove 6 may be formed on the base substrate 1 by a single patterning process. For example, the patterns of the accommodation area 3, the groove 6, the first shoulder 2 and the second shoulder 5 may be formed on the base substrate 1 by a single patterning process.

That is to say, a hydrophobic material layer, such as a layer of fluorinated polyimide resin 7, is formed on the base substrate 1, and then a single patterning process may be performed on the hydrophobic material layer to form the patterns of the accommodation area 3 and the groove 6 on an outer peripheral side of the accommodation area 3. For example, a single patterning process may be performed on the hydrophobic material layer so as to form the patterns of the accommodation area 3, the groove 6, the first shoulder 2 and the second shoulder 5.

It should be understood that, in the method of fabricating an organic light-emitting display substrate, other functional layers may be further formed on the base substrate 1, which will not be described here one by one.

It can be understood that the foregoing implementations are merely exemplary implementations adopted for describing the principle of the present invention, but the present invention is not limited thereto. Those of ordinary skill in the art can make various variations and improvements without departing from the spirit and essence of the present invention, and these variations and improvements shall be considered to fall within the protection scope of the present invention.

What is claimed is:

1. An organic light-emitting display substrate, comprising:
   a base substrate; and
   a pixel defining layer provided on the base substrate and configured to define a plurality of sub-pixel regions and a plurality of
   accommodation areas corresponding to the plurality of sub-pixel regions, wherein:
   the pixel defining layer comprises a plurality of first shoulders which define the plurality of accommodation areas, and a second shoulder; and
   between two adjacent accommodation areas, two grooves are formed by the first shoulders of the two adjacent accommodation areas and the second shoulder;
   the plurality of accommodation areas are configured to accommodate ink for forming an organic light-emitting layer of the organic light-emitting display substrate; and
   the two Grooves are configured to accommodate spillover ink from the plurality of accommodation areas.

2. The organic light-emitting display substrate of claim 1, wherein each of the plurality of accommodation areas is surrounded by one of the plurality of first shoulders.

3. The organic light-emitting display substrate of claim 1, wherein a height of at least one of the first shoulders is smaller than a height of the second shoulder.

4. The organic light-emitting display substrate of claim 1, wherein heights of the plurality of first shoulders are the same and all smaller than a height of the second shoulder.

5. The organic light-emitting display substrate of claim 1, wherein the second shoulder comprises a hydrophobic material.

6. The organic light-emitting display substrate of claim 1, wherein each of the plurality of first shoulders comprises a hydrophobic material or a hydrophilic material.

7. The organic light-emitting display substrate of claim 5, wherein the hydrophobic material comprises fluorinated polyimide resin.

8. The organic light-emitting display substrate of claim 6, wherein the hydrophobic material comprises fluorinated polyimide resin, and the hydrophilic material comprises polyimide resin, $SiO_2$ or $SiN_X$.

9. An organic light-emitting display panel, comprising the organic light-emitting display substrate of claim 1.

10. An organic light-emitting display device, comprising the organic light-emitting display panel of claim 9.

* * * * *